United States Patent [19]

Agrawal et al.

[11] Patent Number: 5,027,315
[45] Date of Patent: Jun. 25, 1991

[54] PROGRAMMABLE LOGIC ARRAY USING INTERNALLY GENERATED DYNAMIC LOGIC SIGNALS AS SELECTION SIGNALS FOR CONTROLLING ITS FUNCTIONS

[75] Inventors: Om P. Agrawal; Joseph A. Brcich, both of San Jose, Calif.

[73] Assignee: Advanced Micro Devices, Inc., Sunnyvale, Calif.

[21] Appl. No.: 401,528

[22] Filed: Aug. 30, 1989

Related U.S. Application Data

[63] Continuation of Ser. No. 656,109, Sep. 28, 1984, abandoned.

[51] Int. Cl.[5] .......................... G06F 9/00; H03K 19/20
[52] U.S. Cl. ................................ 364/900; 364/948.1; 364/949; 364/949.4; 364/965.77; 364/716; 340/825.83; 307/465
[58] Field of Search ... 364/200 MS File, 900 MS File, 364/716; 340/825.79, 825.83, 825.84, 825.86; 307/465, 466, 468, 601, 602, 605, 593

[56] References Cited

U.S. PATENT DOCUMENTS

| | | | |
|---|---|---|---|
| 4,124,899 | 11/1978 | Birkner et al. | 364/716 X |
| 4,422,072 | 12/1983 | Cavlan | 340/825.87 |
| 4,504,749 | 3/1985 | Yoshida | 307/602 X |
| 4,525,714 | 6/1985 | Still et al. | 340/825.83 |
| 4,540,903 | 9/1985 | Cooke et al. | 307/465 |
| 4,567,571 | 1/1986 | Moffett | 364/900 |
| 4,584,686 | 4/1986 | Fritze | 371/37 |
| 4,617,479 | 10/1986 | Hartmann et al. | 364/716 X |
| 4,625,311 | 11/1986 | Fitzpatrick et al. | 371/15 |
| 4,684,830 | 8/1987 | Tsui et al. | 307/465 |
| 4,717,912 | 1/1988 | Harvey et al. | 340/825.53 |
| 4,870,302 | 9/1989 | Freeman | 307/465 |

FOREIGN PATENT DOCUMENTS 57-119523 7/1982 Japan .
58-57824 4/1983 Japan .
59-45722 3/1984 Japan .

OTHER PUBLICATIONS

*The PAL20RA10 Story-the Customization of a Standard Product,* Mark A. Baker and Vincent J. Coli, IEEE MICRO, Oct. 1986.
MMI News Release: "Monolithic Memories' Newest PAL Device Offers Unparalled Design Flexibility", Jul. 19, 1984.
New Product Profile: "PA120RA10 Registered Asynchronous Programmable Array Logic", No. 077, Jun. 1984, Monolithic Memories.
"Programmable Array Logic Devices", Monolithic Memories, PAL20RA10.
AN-131 Application Note, "New PAL Architecture Providers Synchronous and Asynchronous Features in a Single Package", Monolithic Memories.

*Primary Examiner*—Thomas C. Lee
*Attorney, Agent, or Firm*—Fliesler, Dubb, Meyer & Lovejoy

[57] ABSTRACT

The present invention provides an output logic macrocell for controlling configuration of an output for an integrated circuit wich provides a logic signal including a register responsive to a clock signal for latching the logic signal to provide a registered signal. An output selector receives both the logic signal and the registered signal and selects responsive to an output select signal, either the logic signal or the registered signal. A feedback path provides a feedback signal as data which is selected by a feedback selector responsive to a feedback select signal for selecting the logic signal or the registered signal as the feedback signal. Further, a clock signal enable circuit, responsive to a clock enable signal, enables or disables the clock signal to clock the register. Accordingly, the register, the output selector, the feedback path, and the clock enable circuit are all dynamically controllable by respective control signals.

27 Claims, 2 Drawing Sheets

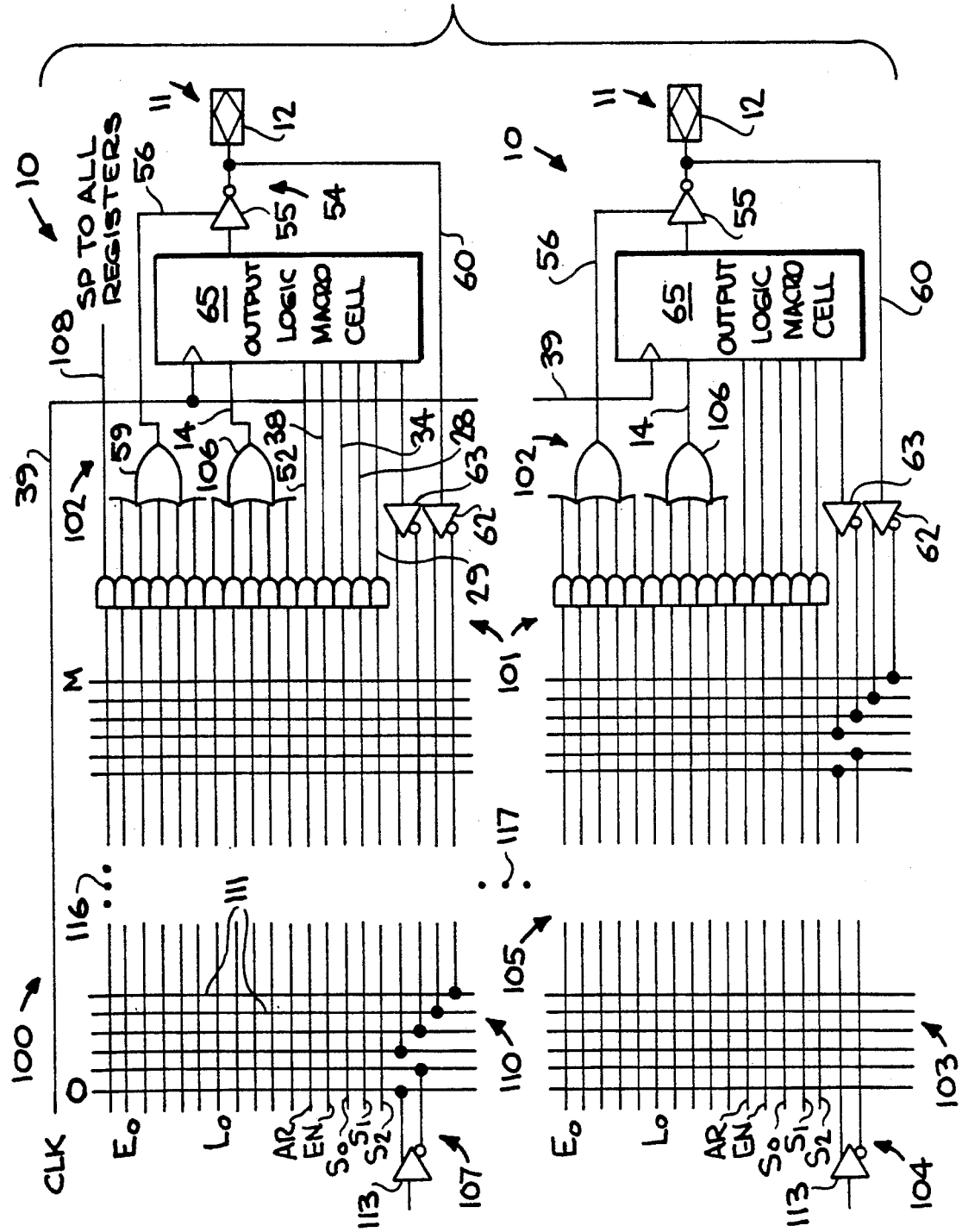

PROGRAMMABLE LOGIC ARRAY USING INTERNALLY GENERATED DYNAMIC LOGIC SIGNALS AS SELECTION SIGNALS FOR CONTROLLING ITS FUNCTIONS

This application is a continuation of patent application Ser. No. 656,109, filed Sept. 28, 1984, now abandoned.

FIELD OF THE INVENTION

The present invention relates to output configuration circuits for controlling signals communicating to and from input/output ports on an integrated circuit package.

BACKGROUND OF THE INVENTION

As the technology for manufacturing integrated circuits progresses, it is becoming possible to put more and more discrete logic components on a single integrated circuit chip. For instance, there can be thousands of discrete logic components, such as, AND-gates, OR-gates, inverters and registers, on a single integrated circuit chip. However, due to limitations in packaging technology, the number of input and output ports to a given integrated circuit chip is limited. Thus, thousands of discrete logic components must be served typically by on the order of a few dozen input/output (I/O) ports. The small number of input/output ports available for a given integrated circuit thus severely restricts the flexibility in design of logic circuits implemented on integrated circuit chips.

Flexibility in design is particularly important for devices such as programmable array logic devices. In a programmable array logic device, a user of the device configures the logic array according to a specific need using field programming techniques. Since the user is constrained in his design choices by the configuration of the input/output pins, the utility of the programmable logic array is limited.

A prior U.S. patent application owned by the assignee in common with the present application, entitled APPARATUS FOR PRODUCING ANY ONE OF A PLURALITY OF SIGNALS AT A SINGLE OUTPUT. Ser. No. 433,253, filing date Oct. 7, 1982, now U.S. Pat. No. 4,717,912, addresses one way in which the configuration of input/output ports may be made more flexible. There, the user is able to select one of two types of output signals for a given output pin by setting a selector means using field programming techniques, such as blowing a fuse or not blowing the fuse, when the designer sets up the logic circuit on the chip. Thus, for example, the designer is able to locate registered outputs and combinatorial outputs on the I/O pins as he desires for a selected logic array package.

Another way in which to increase the flexibility of the design for programmable array logic devices of the prior art provides selectable feedback in the output logic so that the designer may choose using field programming techniques to provide a feedback path directly from the I/O pin to the logic array, in effect, treating the I/O pin as an input pin, or to select a registered output from the logic array as feedback. This sort of feedback system is described in product literature for the Advanced Micro Devices 24-pin IMOX TM Programmable Array Logic Device designated the AmPAL22V10(PAL is a registered trademark of Monolithic Memories, Inc.). An advanced information sheet concerning the AmPAL22V10 was released by Advanced Micro Devices, Inc., Sunnyvale, Calif. dated June, 1983. This advanced information can be referred to for further background to the present invention.

Both the output selector and the feedback selector of the prior art mentioned above involved a designed-in or field programmed selection of the type of feedback or the type of output for a particular I/O pin. Accordingly, the user was limited to one configuration of each I/O pin for the device. Since it is desirable to provide a flexible output logic circuit, there is a need for an output logic circuit which provides for increased flexibility and overcomes the limitations of the prior art.

SUMMARY OF THE INVENTION

The present invention includes an output logic circuit for controlling the configuration of an output which allows for dynamic control of the configuration and increases the flexibility of design for the user of the invention.

An output logic means for controlling configuration of an output for an integrated circuit is provided. The output logic means receives a logic signal from the internal logic of the integrated circuit. A register means, responsive to a clock signal, for latching the logic signal to provide a registered signal is included in the output logic means. An output select means receives both the logic signal and the registered signal and selects, responsive to an output select signal, either the logic signal or the registered signal as output from the output logic means. A feedback means provides a feedback signal to the internal logic of the integrated circuit. The feedback means includes a feedback select means, responsive to a feedback select signal, for selecting the logic signal or the registered signal as the feedback signal. Further, a clock signal enable means, responsive to a clock enable signal, enables or disables the clock signal to clock the register means. Accordingly, the register means, the output select means, the feedback means, and the clock enable means are all controllable by respective control signals.

Means for dynamically providing the output select signal, means for dynamically providing the feedback select signal, means for dynamically providing the clock enable signal and means for providing the clock signal are included in the present invention.

Further flexibility and dynamic control is attained in a preferred embodiment with an output means, responsive to an output enable signal, for providing the signal selected from the output select means in the output logic means as an output signal to an I/O port on the integrated circuit package. Also, means for dynamically providing the output enable signal are included.

Other means for providing flexibility and dynamic control include means for dynamically providing reset or preset signals to the register means. Further, the I/O port may be configured to provide to the internal logic of the integrated circuit input independent from the feedback means. Means are also included for programming clock polarity.

BRIEF DESCRIPTION OF THE DRAWINGS

FIG. 2 is a schematic diagram of a programmable array logic device implementing the present invention.

DETAILED DESCRIPTION

With reference to the figures, a detailed description of the present invention is provided.

Figure 1:
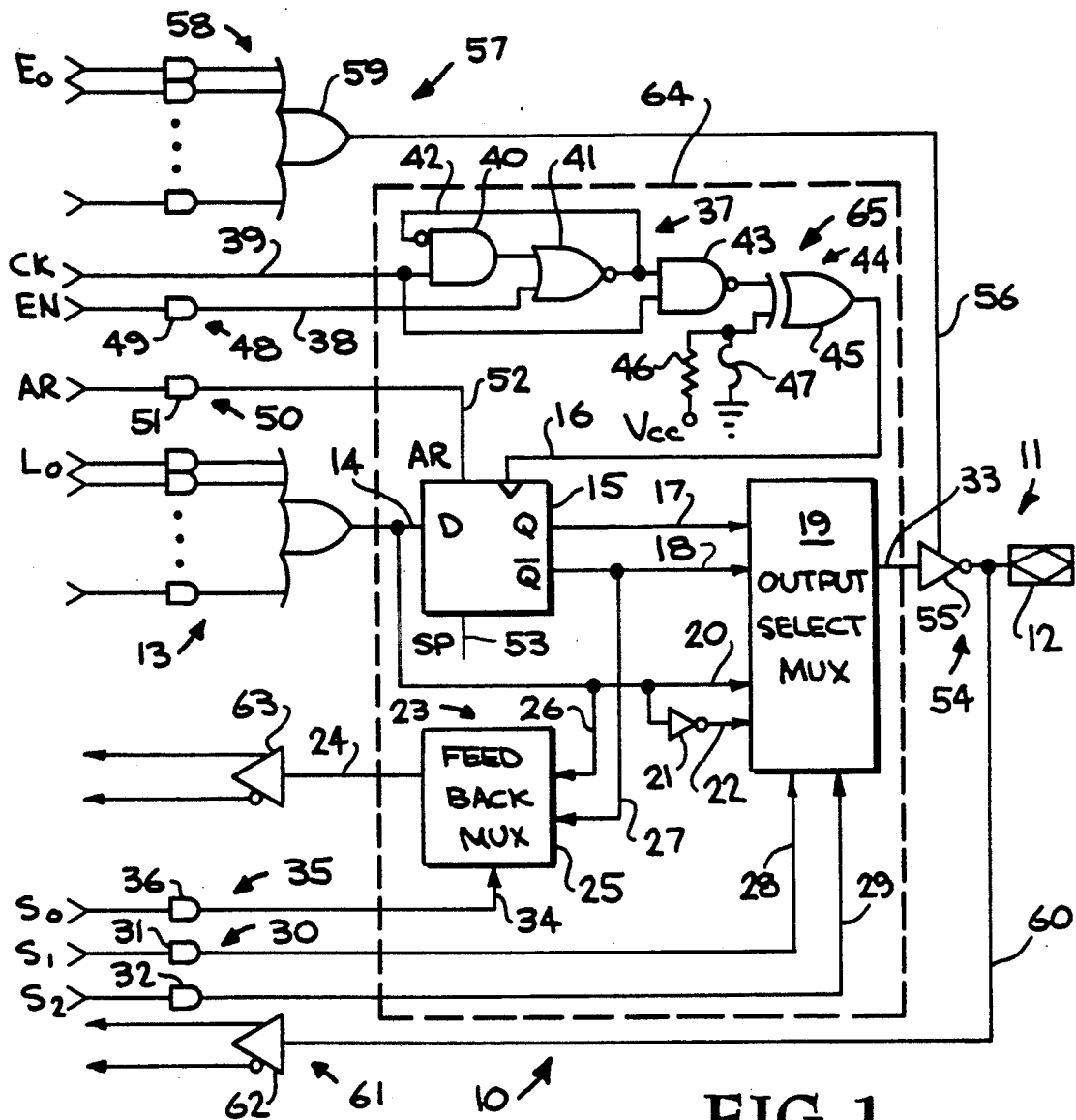
FIG. 1 is a logic diagram of a preferred embodiment of the present invention.

FIG. 1 shows a diagram of the output logic circuit 10 of the present invention. The output logic circuit 10 as shown in FIG. 1 controls configuration of an input/output port 11, such as an I/O pin 12.

The output logic circuit 10 is connected to a logic means 13 for providing a logic signal on a line 14. Line 14 is connected as the input to a register means 15, such as D-type register as shown in the FIG. 1. Responsive to a clock signal on line 16, the register means 15 latches the logic signal on line 14 and provides a registered signal Q on line 17. In the preferred embodiment, the register means 15 also provides the complement $\overline{Q}$ of the registered signal on line 18.

The output logic circuit 10 shown in FIG. 1 further comprises an output select means 19, such as an output select 4 to 1 multiplexer, which receives the registered signal Q on line 17 and the complement $\overline{Q}$ of the registered signal on line 18. The logic signal provided by the logic means 13 on line 14 is also received by the output select means 19 across line 20. The complement of the logic signal is provided through an inverter 21 on line 22 to the output select means 19. Additional register means and logic signals can be provided by the designer to generate input to the output select means 19.

The output select means 19 is controlled to select either the registered signal Q, its complement $\overline{Q}$, the non-registered logic signal, or its complement through an output select signal $S_1, S_2$ provided over lines 28 and 29 respectively. A means 30 for dynamically providing the output select signal is included in the present invention. As shown in FIG. 1, the means 30 for dynamically providing the output select signals is implemented using programmable AND arrays 31 and 32. The construction of the programmable AND array is discussed in more detail below. As appreciated in the art, other means for dynamically providing the control signals in this invention can be used, such as a combination of logic signals from a plurality of programmable AND arrays.

With a 2-bit output select signal $S_1$, $S_2$, the output select means 19 selects from among the four inputs on lines 17, 18, 20 and 22 to provide an output signal on line 33.

Included in the output logic circuit 10 of FIG. 1 is a feedback means 23 for providing a feedback signal on line 24. The feedback means 23 includes a feedback select means 25, such as a feedback 2 to 1 multiplexer. The feedback select means 25 receives the logic signal provided by the logic means 13 across line 26. Also the feedback select means 25 receives the complement $\overline{Q}$ of the registered signal across line 27. As should be appreciated in the art, the feedback select means 25 can be adapted during manufacture to receive two or more of the registered signal Q, the complement $\overline{Q}$ of the registered signal, the logic signal or the complement of the logic signal in the circuit shown in FIG. 1 as desired. In the preferred embodiment, the feedback select means 25 receives either the registered signal Q or its complement $\overline{Q}$ from register means 15 and either logic signal from line 14 or its complement.

The feedback select means 25 is controlled in response to a feedback select signal $S_0$ on line 34. Means 35 for dynamically providing the feedback select signal on line 34, such as the programmable AND array 36 or other logic circuits, are included. Thus in response to a 1-bit feedback select signal $S_0$, the feedback select means 25 selects from the signals on lines 26 or 27 to provide a feedback signal on line 24. The feedback signal on line 24 is provided to an input buffer such as the true and complement buffer 63 for feedback to the internal logic circuits in the integrated circuit.

The output logic circuit 10 shown in FIG. 1 further comprises a clock signal enable means 37 responsive to a clock enable signal EN on line 38 for providing the clock signal on line 16 which clocks register means 15. A clock means (not shown) provides a clock signal CK on line 39. The clock signal CK on line 39 is input into an AND-gate 40 and the clock enable signal EN on line 38 is input into a NOR-gate 41. The output of the NOR-gate 41 is provided as feedback on line 42 and inverted as a second input of the AND-gate 40. The output of the AND-gate 40 is provided as a second input to the NOR-gate 41. The output of the NOR-gate 41 is provided as an input to a NAND-gate 43. Also the clock signal CK on line 39 is provided as a second input to the NAND-gate 43. Thus a clock signal is provided at the output of the NAND-gate 43 which is enabled by the clock enable signal EN on line 38.

Further included in the preferred embodiment is a means 44 for controlling the polarity of the clock signal such as the exclusive OR-gate 45. The clock signal is inputted as one input to the exclusive OR-gate 45. The other input of the exclusive OR-gate 45 is provided through a field programmable circuit as shown in FIG. 1. The circuit includes a resistor 46 connected a high potential $V_{CC}$. In parallel with the resistor 46 is a fuse 47 connected to ground. The fuse 47 is a field programmable fuse which may be blown or not blown as the user desires when he sets up the device to choose clock polarity. By using this field programming technique, the polarity of the clock can be controlled. Means for dynamically providing a clock polarity control signal can be implemented, in place of the field programmable input, such as with programmable AND arrays, a combination of programmable AND arrays, or the like. As can be seen in FIG. 1, the clock signal of selected polarity is provided on line 16 at the output of the exclusive OR-gate 45.

The clock enable signal EN on line 38 is provided by a means 48 for dynamically providing the clock enable signal EN. As shown in FIG. 1, the means 48 is accomplished using the programmable AND array 49 or other logic circuits.

An additional feature of the preferred embodiment shown in FIG. 1 includes means 50 for dynamically providing an asynchronous reset signal AR to the register means 15. The means 50 is accomplished in FIG. 1 by the programmable AND array 51 or by other logic circuitry. The asynchronous reset will cause the register means 15 to provide a zero output on line 17 when the asynchronous reset signal AR goes high. This switching occurs independent of the clock signal. The asynchronous reset signal AR is received over line 52 by the register means 15.

The register means 15 also receives a synchronous preset signal SP over line 53. When the synchronous preset signal is set, the output of the register means 15 is set to a high signal on line 17 when clocked by the clock signal. Means providing the synchronous preset signal SP or asynchronous reset signal AR are not shown in FIG. 1, but can be implemented dynamically using programmable AND arrays or the like.

The output logic circuit 10 of FIG. 1 also includes an output means 54 such as the inverter 55 which receives the output signal on line 33 selected by the output select means 19. The inverter 55 is enabled by an output enable signal on line 56. Means 57 for dynamically providing the output enable signal on line 56 are also included. The means 57 in FIG. 1 are accomplished by the sum of a plurality 58 of products provided by programmable AND arrays. The sum is provided through the multiple input OR-gate 59 on line 56. Other logic circuitry can be provided to generate the output enable signal.

An additional feature of the output logic circuit 10 of FIG. 1 includes means for providing a signal from the I/O pin 12 as feedback. The means includes a circuit path 60 from the I/O pin 12 directly to an input buffer means 61 such as the true and complement buffer 62.

To simplify the description of the circuits shown in FIG. 2, the portions of the output logic circuit 10 within the dashed line 64 are termed the output logic macrocell 65.

In order to more clearly discuss the function of the output logic circuit 10 of the present invention, FIG. 2 depicts an implementation of the present invention in a programmable array logic device 100. The programmable array logic device 100 shown in FIG. 2 is constructed using the sum of products scheme familiar to those skilled in the art, although other combinations of logic cells can be used. Accordingly there are a plurality of multiple input programmable AND arrays 101 formed on the device. The AND arrays 101 provide what is known as a "product term" which is summed using the plurality of multiple input OR-gates 102. Accordingly the output of each of the OR-gates 102 is a "sum-of-products term".

Figure 3:
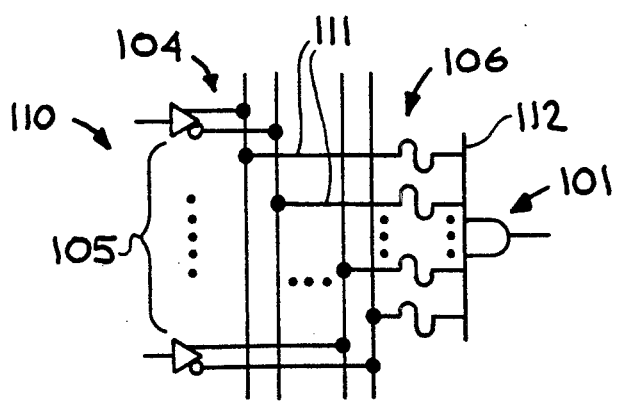
FIG. 3 is a diagram of a logic equivalent of a programmable AND array, a plurality of which are depicted schematically in FIGS. 1 and 2.

The diagram of FIG. 2 schematically shows the programmable AND arrays using a grid 110 of lines. FIG. 3 is used to illustrate the logical equivalent of the grid 110. Each of the vertical lines 103 in FIG. 2 represents an input signal 104 or one of the feedback signals from the true and complement buffers 62, 63. Each of the horizontal lines 105 shown in FIG. 2 represents a plurality of inputs, one for each intersection 111 of lines to the programmable AND array 101. As illustrated in FIG. 3, each intersection 111 of a vertical line with a horizontal line is depicted as a fuseable link 106 between one of the vertical lines 103 and one of the multiple inputs 112 to the programmable AND array 101. The programmable AND array 101 is field programmable using well known fuse programming techniques for selecting the inputs controlling the product term of the particular programmable AND array 101.

As can be seen in FIG. 2, each of the input signals are provided through buffers such as a true and complement buffer 113 to the input lines 104. Each of the input signals and feedback signals from the true and complement buffers 113, 63, 62 can be linked through a programmable link to any of the programmable AND arrays 101 on the programmable array logic device. Thus the programmable array logic device 100 is configurable by the user to accomplish a wide variety of logic tasks. The output logic circuit 10 of the present invention increases the flexiblity of the programmable array logic device 100.

An implementation of the output logic circuit 10 of the present invention on the programmable array logic device 100 is described. Reference numbers used in FIG. 1 will be used in FIG. 2 to identify like components.

Accordingly, the output logic macrocell 65 described in FIG. 1 is included in the programmable array logic device 100 for each of the input/output ports 11 in the programmable array logic device. In FIG. 2, the input/output ports 11 are implemented with I/O pins 12 of the integrated circuit package. The output logic circuit 10 of the present invention configures the input/output port 11 as discussed above in detail with reference to FIG. 1.

The output means 54 is implemented with the inverter 55 as discussed with reference to FIG. 1. The output enable signal 56 is implemented as a sum of products term from the plurality of programmable AND arrays. In FIG. 2, five programmable AND arrays are provided as input to the OR-gate 59 although the designer can provide any number of AND arrays as input to OR-gate 59. The output of the OR-gate 59 is the output enable signal on line 56. Thus the circuit including the sum of outputs from the programmable AND arrays dynamically provides an output enable signal on line 56.

The logic signal on line 14 is provided as a sum-of-product term combinatorial signal from the OR-gate 106. In FIG. 2 a five-input OR-gate 106 receiving signals from five separate programmable AND arrays 101 provides the combinatorial signal on line 14. However as is appreciated in the art any number of programmable AND arrays can be designed as input to the OR-gate 106 to provide the combinatorial signal.

The means for providing the clock signal is accomplished by line 39. In the preferred embodiment a clock is connected to an input pin (not shown) providing a signal 107 to the programmable array in addition to the clock signal CK on line 39. In FIG. 2, the connection between the clock signal line 39 and the input 107 providing an input to the array is not shown since it is not necessary to the invention.

Each of the dynamic control signals other than the output enable signal on line 56 discussed with reference to FIG. 1 are provided as the output of a single programmable AND array. Accordingly the asynchronous reset signal AR is provided as the output of a programmable AND array on line 52. The clock enable signal EN is provided as the output of a programmable AND array on line 38. The feedback select signal $S_0$ is provided as the output of a programmable AND array on line 34. The output select signal is a two-bit signal provided as the output of two programmable AND arrays on lines 28 and 29 respectively. Any of the control signals mentioned above can be implemented by more complicated logic circuitry, such as sum-of-products terms, if desired.

Each of the output logic circuits 10 on the programmable array logic device 100 includes the output logic macrocell 65. The means providing the various dynamic control signals can be configured in a variety of manners, either as a simple product term from the output of a single programmable AND array 101 or as a sum of products term from the output of an OR-gate 102 summing a plurality of programmable AND arrays. Further, each I/O pin can be configured uniquely.

The programmable array logic device 100 shown in FIG. 2 is illustrated with two output logic circuits 10 configuring two separate I/O pins. However the ellipses 116, 117 indicate that any number of I/O pins and inputs can be designed into the device and any size of programmable array logic grid 110 can be formed within the constraints of integrated circuit and packaging technology.

A typical programmable array logic device may for instance include 24 input/output pins, half of which are configured using an output logic circuit 10 such as taught by the present invention.

In FIG. 2, the synchronous preset signal SP is provided in common to all the register means 15 (See FIG. 1) in the output logic macrocells 65 on the programmable array logic device 100. The synchronous preset signal SP is dynamically provided as a product term from the output of a programmable AND array on line 108. As with the other dynamic control signals, the synchronous preset signal SP or asynchronous reset signal AR can be implemented with other logic circuitry such as a sum-of-products term according to the present invention. It is not shown connected to each of the output logic macrocells 65 in order to simplify the drawing.

The function of the programmable array logic device 100 is enhanced by the dynamically provided control signals. By way of example, a programmable, dynamically changing output enable signal on line 56 can disable the output means 54 and allow the I/O pin 12 to provide an input signal independent of the output signal provided by the output select means 19 in the output logic macrocell 65. The input signal from the I/O pin 12 is provided over line 60 to the true and complement buffer 62 as feedback to the programmable logic array grid 110. When the output enable signal on line 56 changes back dynamically, the I/O pin 12 resumes its function as an output pin.

An example of an enhancement in function available through the dynamically provided asynchronous reset signal AR on line 52 proceeds as follows. When the asynchronous reset signal AR on line 52 becomes high, the output of the register means 15 will change to low. Thus the complement $\overline{Q}$ of the output of the register means 15 on lines 18 and 27 will go high. The dynamic feedback select signal $S_0$ and the dynamic output select signal $S_1$, $S_2$ then have a predictable registered output on lines 18 and 27 to select which is independent of the combinatorial logic signal provided across line 14. Thus by coordinating the programming of the programmable AND arrays providing the asynchronous reset signal AR on line 52 and the feedback select signal $S_0$ on line 34 and the output select signal $S_1$, $S_2$ on lines 28 and 29, a particular function of the programmable array logic device 100 can be implemented which can not be done in prior art devices. Other combinations of the control signals can be conceived to provide other functions.

A further example of an enhancement in the operation of the programmable array logic device 100 involves the dynamically provided clock enable signal EN on line 38. By dynamically disabling the clock signal provided to the register means 15 across line 16, the user will be able to programmably store a particular signal in the register means 15 while the clock signal on line 16 is disabled. By coordinating the output select signals $S_1$, $S_2$ on lines 28 and 29 with the clock enable signal EN on line 38, the user will be able to program the selection as an output signal on line 33 a delayed registered signal dependent on dynamic factors in the programmable logic array 100. Once again, a plurality of other configurations using the dynamically programmable clock enable signal EN on line 38 can be conceived.

Although not shown in the embodiment in FIG. 2, the synchronous preset signal could likewise be provided dynamically to each of the output logic macrocells 65 independently providing additional flexibility in the output logic circuit 10 of the present invention.

By providing the feedback select means 25 which selects from a register term on line 27 and a combinatorial term on line 26 independently from the output signal on line 33, an additional feature enhancing the performance of the programmable array logic device 100 can be seen. Thus by coordinating the output enable signal on line 56 with the feedback select signal $S_0$ on line 34, the output means 54 can be disabled allowing the I/O pin 12 to provide an input signal across line 60 to the true and complement buffer 62 at the same time that a logic term, either the combinatorial term on line 26 or the register term on line 27, can be fed back through the true complement buffer 63 to the programmable logic array. Thus the feedback through the true complement buffer 63 is not affected by the disabling of the output means 54.

As the foregoing examples illustrate, the function of the programmable array logic device 100 is greatly enhanced by the the output logic circuit 10 of the present invention. Further the output logic circuit 10 can be utilized in a variety of integrated circuit devices to enhance the flexibility and dynamic control of the particular circuit implemented on the integrated circuit chip. In this manner the limitation occasioned by the relatively small number of input/output ports on a given integrated circuit chip with respect to the number of logic devices implemented on the chip can be minimized.

The foregoing description of a preferred embodiment of the invention has been presented for purposes of illustration and description. It is not intended to be exhaustive or to limit the invention to the precise form disclosed, and obviously many modifications and variations are possible in light of the above teaching. The programmable array logic device embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An output logic circuit receiving a logic signal from a functional logic circuit and a clock signal coupled between the functional logic circuit and an input-/output port, comprising:

register means, connected to receive the logic signal and responsive to the clock signal, for storing said logic signal to provide a registered signal;

output select means, connected to receive the logic signal and the registered signal and responsive to an output select signal, for dynamically selecting said logic signal or said registered signal for supply as a selected signal to the input/output port;

feedback means for providing a feedback signal to the functional logic circuit, including a feedback select means, connected to receive the logic signal and the registered signal and responsive to a feedback select signal, for dynamically selecting said logic signal or said registered signal as the feedback signal;

the functional logic circuit including means, in communication with said feedback select means, for dynamically providing said feedback select signal; and means, in communication with said output select means, for dynamically providing said output select signal.

2. The circuit of claim 1, wherein said register means includes:

means, responsive to a reset signal, for asynchronous reset of said register means; and the functional logic circuit includes means, in communication with the means for asynchronous reset, for dynamically providing said reset signal.

3. The circuit of claim 1, wherein said register means includes:

means, responsive to a preset signal, for preset of said register means, and the functional logic circuit includes means, in communication with the means for preset, for dynamically providing said preset signal.

4. The circuit of claim 1, further including:

output enable means, coupled between said output select means and said input/output port and responsive to an output enable signal, for dynamically enabling the selected signal from said output select means as an output signal to the input/output port; and the functional logic circuit includes means, in communication with the output enable means, for dynamically providing the output enable signal.

5. The output logic circuit of claim 1, further including:

clock signal enable means, coupled to the register means and responsive to a clock enable signal, for dynamically enabling said clock signal to clock said register means; and the functional logic circuit includes means, in communication with said clock signal enable means, for dynamically providing said clock enable signal.

6. The circuit of claim 5, wherein said clock enable means includes:

means, coupled to receive the clock signal, for programmably selecting the polarity of the clock signal.

7. The circuit of claim 1, further including:

means, coupled to receive the clock signal and to the registered means and responsive to a polarity select signal, for dynamically selecting the polarity of the clock signal; and the functional logic circuit includes means, in communication with the means for selecting the polarity, for dynamically providing said polarity select signal.

8. The circuit of claim 1, wherein:

said register means provides said registered signal and a complement of said registered signal; and further including means, connected to receive said logic signal, for complementing said logic signal to provide a complement of said logic signal; and said output select means is further connected to receive said complement of said logic signal and said complement of said registered signal and dynamically selects said registered signal, said complement of said registered signal, said logic signal, or said complement of said logic signal as said output signal.

9. The circuit of claim 1, further comprising:

means, in communication with the input/output port, for providing data signals from the input/output port as feedback to the functional logic circuit.

10. In a programmable array logic device having a first plurality of logic cells for dynamically generating logic signals, a second plurality of combinatorial means for combining a subset of said logic signals to generate a plurality of combinatorial signals, said logic signals and said combinatorial signals being dynamic signals, an output logic circuit receiving one of said combinatorial signals and a clock signal coupled between one of said second plurality of combinatorial means and an input/output port, comprising:

clock enable means, coupled to receive the clock signal and responsive to a clock enable signal for dynamically enabling supply of the clock signal to a clock line;

means, connected to the clock enable means and responsive to a plurality select signal, for dynamically selecting an active high or an active low polarity for the clock signal supplied to the clock line;

register means, connected to the clock line and responsive to the clock signal on the clock line, for storing said one of said combinatorial signals;

means for connecting a first pre-selected one of said dynamic signal as said clock enable signal to said clock enable means; and means for connecting a second pre-selected one of said dynamic signals as said polarity select signal to said means for selecting polarity.

11. In a programmable array logic device having a first plurality of logic cells for dynamically generating logic signals, and a second plurality of combinatorial means for combining a subset of said logic signals to generate a plurality of combinatorial signals; said logic signals and said combinatorial signals being dynamic signals, an output logic circuit receiving one of said combinatorial signals and a clock signal coupled between one of said second plurality of combinatorial means and an input/output port, comprising:

register means for storing said one of said combinatorial signals and providing a stored signal;

means, coupled with said register means and responsive to a reset signal, for dynamically resetting the stored signal in said register means;

output select means, connected to receive said one of said combinatorial signals and said stored signal, and responsive to an output select signal, for dynamically selecting said stored signal or said one of said combinatorial signals as a selected signal to the input/output port;

means for connecting one of said dynamic signals as said output select signal to said output select means; and means for connecting another one of said dynamic signals as said reset signal to said means for resetting.

12. The circuit of claim 11, wherein:

said stored means provides said registered signal and a complement of said stored signal; and further including means, connected to receive said one of said combinatorial signals, for complementing said one of said combinatorial signals to provide a complement of said one combinatorial signal; and said output select means is further connected to receive said complement of said stored signal and said complement of said one combinatorial signal and selects said stored signal, said complement of said stored signal, said one combinatorial signal, or said complement of said one combinatorial signal as said selected signal.

13. The circuit of claim 11, further comprising:

output enable means, coupled between said output select means and said input/output port and responsive to an output enable signal for dynamically enabling the selected signal as an output signal at said input/output port; and means for connecting another of said combinatorial signals as said output enable signal to said output enable means.

14. The circuit of claim 13, further comprising:

means, connected between said input/output port and one or more of said logic cells, for providing a data signal from said input/output port as an input signal to said one or more logic cells.

15. A programmable array logic device, receiving a clock signal and a plurality of data signals, having a plurality of input/output ports, comprising:

a programmable logic cell array means responsive to the plurality of data signals for providing a set of logic signals;

combinatorial means for combining a subset of said set of logic signals to provide a plurality of combinatorial signals, said logic signals and said combinatorial signals being dynamic signals;

output logic means, receiving one of said combinatorial signals and the clock signal, coupled to one of the input/output ports for controlling the input/output port including register means, responsive to the clock signal, for storing said one combinatorial signal to provide a registered signal;

output select means, connected to receive said one combinatorial signal and said registered signal and responsive to an output select signal, for dynamically selecting said combinatorial signal or said registered signal as a selected signal, feedback means for providing a feedback signal as data to said programmable logic cell array means including a feedback select means, connected to receive said one combinatorial signal and said registered signal and responsive to a feedback select signal, for dynamically selecting said one combinatorial signal or said registered signal as said feedback signal, and clock signal enable means, connected to receive said clock signal and to said register means and responsive to a clock enable signal, for dynamically enabling said clock signal to clock said register means;

output enable means, connected to receive said selected signal and to the one input/output port and responsive to an output enable signal, for enabling the selected signal from said output select means as an output signal at the one input/output port, means for connecting a first of said dynamic signals as the clock enable signal to the clock signal enable means;

means for connecting a second of said dynamic signals as the feedback select signal to the feedback select means;

means for connecting a third of said dynamic signals as the output select signal to the output select means;

means for connecting a fourth of said dynamic signals as the output enable signal to the output enable means.

16. The device of claim 15, wherein said register means of said output logic means includes:

means, responsive to a reset signal, for asynchronous reset of said register means, and means for connecting a fifth of said dynamic signals as said reset signal to said means for asynchronous reset.

17. The device of claim 15, wherein said register means of said output logic means includes:

means, responsive to a preset signal, for preset of said register means, and means, for connecting a fifth of said dynamic signals as said preset signal to said means for preset.

18. The circuit of claim 15, wherein said clock enable means includes:

means coupled to receive the clock signal for programmably controlling the polarity of said clock signal.

19. The circuit of claim 15, further including:

means, coupled to receive the clock signal and to the register means and responsive to a polarity select signal, for dynamically selecting the polarity of the clock signal; and means for connecting a fifth of said dynamic signals as said polarity selected signal to said means for selecting the polarity.

20. The circuit of claim 15, wherein:

said register means provides said registered signal and a complement of said registered signal; and further including means, connected to receive said one combinatorial signal, for complementing said one combinatorial signal to provide a complement of said one combinatorial signal; and said output select means is further connected to receive said complement of said registered signal and said complement of said one combinatorial signal and dynamically selects said registered signal, said complement of said registered signal, said one combinatorial signal, or said complement of said one combinatorial signal as said selected signal.

21. The circuit of claim 15, further comprising:

means, connected between said one input/output port and said programmable logic cell array means, for providing data signals from said one input/output port to said programmable logic cell array means.

22. In a programmable array logic device having a first plurality of logic cells for dynamically generating logic signals, and a second plurality of combinatorial means for combining a subset of said logic signals to generate a plurality of combinatorial signals, the logic signals and combinatorial signals being dynamic signals, an output logic circuit, receiving one of said combinatorial signals and a clock signal, coupled between one of said second plurality of combinatorial means and an input/output port, comprising:

register means for storage said one of said combinatorial signals and providing a registered signal;

output select means, connected to receive said one of said combinatorial signals and said registered signal and responsive to an output select signal, for dynamically selecting said registered signal or said one of said combinatorial signals as a selected signal for supply to the input/output port;

feedback means for providing a feedback signal to one or more of the logic cells including a feedback select means, connected to receive said one of said combinatorial signals and said registered signal and responsive to a feedback select signal, for dynamically selecting said one of said combinatorial signals or said registered signal as the feedback signal;

means for connecting one of said dynamic signals as said output select signal to said output select means; and means for connecting another one of said dynamic signals as said feedback select signal to said feedback select means.

23. The circuit of claim 22 further comprising:
means, connected between said input/output port and one or more of said logic cells, for providing a data signal from said input/output port as an input signal to said one or more logic cells.

24. The circuit of claim 22 further comprising:
output enable means, coupled between said output select means and said input/output port and responsive to an output enable signal for dynamically enabling supply of the selected signal from said output select means as an output signal to the input/output port; and means for connecting another of said combinatorial signals as said output enable signal to said output enable means.

25. The circuit of claim 24 further comprising:
output enable means, coupled between said output select means and said input/output port and responsive to an output enable signal for enabling supply of the selected signal from said output select means as an output signal to the input/output port; and means for connecting another of said combinatorial signals as said output enable signal to said output enable means.

26. The circuit of claim 22 further comprising:
means, coupled to receive the clock signal and to the register means and responsive to a polarity select signal, for selecting the polarity of the clock signal; and means for connecting a third of said dynamic signals as said polarity select signal to said means for selecting the polarity.

27. In a programmable array logic device having a first plurality of logic cells for dynamically generating logic signals, and a second plurality of combinatorial means for combining a subset of said logic signals to generate a plurality of combinatorial signals, the logic signals and combinatorial signals being dynamic signals, an output logic circuit, receiving one of said combinatorial signals and a clock signal, coupled between one of said second plurality of combinatorial means and an input/output port, comprising:

register means for storing said one of said combinatorial signals providing a registered signal;

output select means, connected to receive said one of said combinatorial signals and said register signal and responsive to an output select signal, for dynamically selecting said registered signal or said one of said combinatorial signals as a selected signal for supply to the input/output port;

feedback means coupled to said register means for providing said registered signal as a feedback signal to one or more of the logic cells;

means for connecting one of said dynamic signals as said output select signal to said output select means;

means connected between said input/output port and one or more of said logic cells, for providing a data signal from said input/output port as an input signal to said one or more logic cells;

output enable means, coupled to said output select means and said input/output port and responsive to an output enable signal, for dynamically enabling supply of the selected signal from said output select means as an output data signal to the input/output port; and means for connecting another of said dynamic signals as said output enable signal to said output enable means.

* * * * *